(12) United States Patent
Mouli

(10) Patent No.: US 7,443,006 B2
(45) Date of Patent: *Oct. 28, 2008

(54) PHOTON AMPLIFICATION OF IMAGE SENSORS

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 97 days.

This patent is subject to a terminal disclaimer.

(21) Appl. No.: 11/476,755

(22) Filed: Jun. 29, 2006

(65) Prior Publication Data
US 2006/0244016 A1  Nov. 2, 2006

Related U.S. Application Data

(63) Continuation of application No. 10/916,427, filed on Aug. 12, 2004, now Pat. No. 7,145,189.

(51) Int. Cl.
H01L 31/0232 (2006.01)
(52) U.S. Cl. ...................... 257/436; 257/292
(58) Field of Classification Search ............... 257/225, 257/227, 436, 439, 607, 632, 635, 292
See application file for complete search history.

(56) References Cited

U.S. PATENT DOCUMENTS 6,624,925 B2   9/2003   Hasson et al.
7,145,189 B2 * 12/2006  Mouli ............... 257/225
2003/0063204 A1  4/2003  Suda

* cited by examiner

Primary Examiner—Mark Prenty
(74) Attorney, Agent, or Firm—Dickstein Shapiro LLP (57) ABSTRACT

A pixel cell having a substrate, photo-conversion device, and at least one dielectric layer over the photo-conversion device. The at least one dielectric layer includes one or more rare earth elements for amplifying the number of photons capable of being converted to charge by the photo-conversion device.

14 Claims, 8 Drawing Sheets

PHOTON AMPLIFICATION OF IMAGE SENSORS

CROSS-REFERENCE TO RELATED APPLICATIONS

The present application is a continuation of U.S. patent application Ser. No. 10/916,427, filed on Aug. 12, 2004, now U.S. Pat. No. 7,145,189, the disclosure of which is incorporated herein by reference in its entirety.

FIELD OF THE INVENTION

The present invention relates generally to the field of semiconductor devices and more particularly to photon amplification in semiconductor devices, including image sensors.

BACKGROUND OF THE INVENTION

CMOS image sensors are increasingly being used as a low cost alternative to charge coupled device (CCD) image sensors. In a CMOS image sensor, the active elements of a pixel cell perform the necessary functions of: (1) photon to charge conversion; (2) accumulation of image charge; (3) transfer of charge to the sensing node accompanied by charge amplification; (4) resetting the sensing node to a known state before the transfer of charge to it; (5) selection of a pixel for readout; and (6) output and amplification of a signal representing pixel charge from the sensing node.

CMOS image sensors of the type discussed above are generally known as discussed, for example, in Nixon et al., "256×256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452453 (1994). See also U.S. Pat. Nos. 6,177,333 and 6,204,524, which describe the operation of conventional CMOS image sensors and are assigned to Micron Technology, Inc., the contents of which are incorporated herein by reference.

Figure 1A:
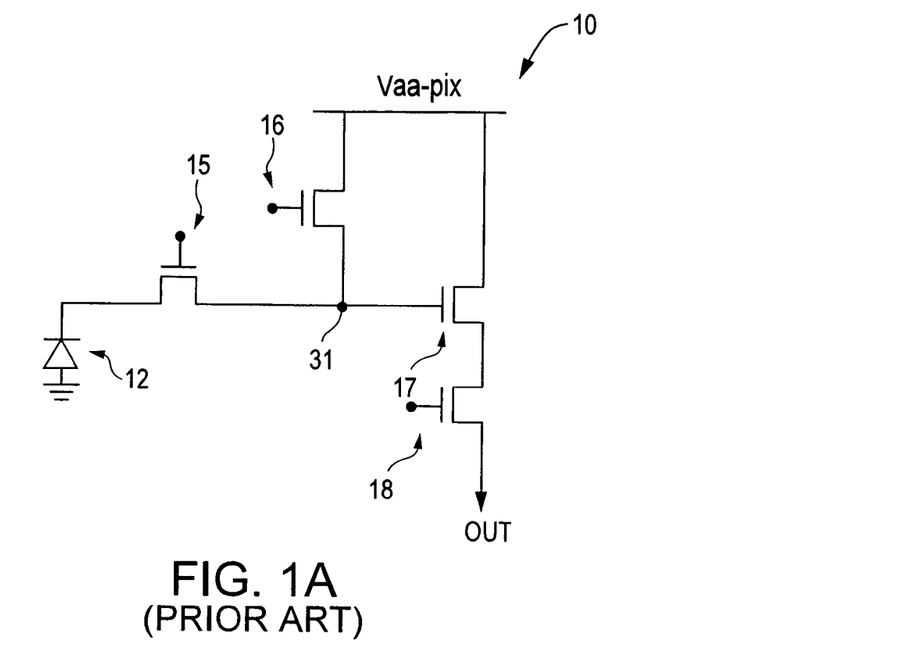
FIG. 1A is a schematic diagram of a conventional pixel cell.

A schematic diagram of a conventional CMOS pixel cell 10 is shown in FIG. 1A. The illustrated CMOS pixel cell 10 is a four transistor (4T) cell. The CMOS pixel cell 10 generally comprises a photo-conversion device 12 for generating and collecting charge generated by light incident on the pixel cell 10, and a transfer transistor 15 for transferring the photoelectric charge from the photo-conversion device 12 to a sensing node, typically a floating diffusion region 31. The floating diffusion region 31 is electrically connected to the gate of an output source follower transistor 17. The pixel cell 10 also includes a reset transistor 16 for resetting the floating diffusion region 31 to a predetermined voltage (shown as the array pixel voltage Vaa-pix); and a row select transistor 18 for outputting a signal from the source follower transistor 17 to an output terminal in response to an address signal.

Figure 1B:
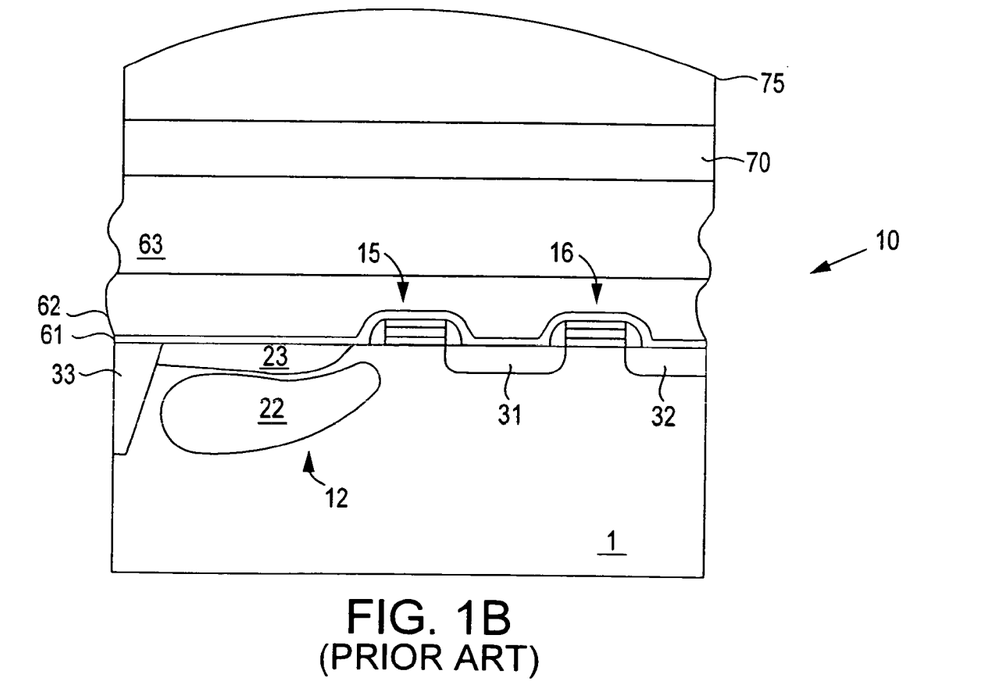
FIG. 1B is a cross sectional view of a portion of the pixel cell of FIG. 1A.

FIG. 1B is a cross-sectional view of a portion of the pixel cell 10 of FIG. 1 depicting the photo-conversion device 12. The illustrated photo-conversion device 12 is formed as a pinned photodiode. The photodiode has a p-n-p construction comprising a p-type surface layer 23 and an n-type photodiode region 22 within a p-type substrate 1. The photodiode 12 is adjacent to and partially underneath the transfer transistor 15. The reset transistor 16 is on a side of the transfer transistor 15 opposite the photodiode 12. As shown in FIG. 1B, the reset transistor 16 includes a source/drain region 32. The floating diffusion region 31 is between the transfer and reset transistors 15, 16.

A first and second dielectric layers 61 and 62 are respectively provided over the transistors 15, 16 and substrate 1. An interlayer dielectric (ILD) region 63 is provided over the second dielectric layer 62. The ILD region 63 typically includes multiple layers of interlayer dielectrics along with conductors, which form connections between devices of the pixel cell 10 and from the pixel cell 10 to other circuitry (not shown). Typically, a color filter 70, which selects a particular range of wavelengths, is provided over the ILD region 63. Over the filter 70 is a microlens 75, which focuses light onto the photodiode 12.

In the CMOS pixel cell 10 depicted in FIGS. 1A and 1B, electrons are generated by photons of electromagnetic radiation incident on the photo-conversion device 12 and are stored in the n-type photodiode region 22. These charges are transferred to the floating diffusion region 31 by the transfer transistor 15 when the transfer transistor 15 is activated. The source follower transistor 17 produces an output signal from the transferred charges. A maximum output signal is proportional to the number of electrons extracted from the n-type photodiode region 22.

It is known that not every incident photon generates an electron. The percentage of incident photons converted to electrons depends upon the quantum efficiency of the pixel cell. It is advantageous to have a pixel cell with improved quantum efficiency.

BRIEF SUMMARY OF THE INVENTION

Exemplary embodiments of the invention include a pixel cell having a substrate, photo-conversion device, and at least one dielectric layer over the photo-conversion device. The at least one dielectric layer includes one or more rare earth elements for amplifying the number of photons capable of being converted to charge by the photo-conversion device.

BRIEF DESCRIPTION OF THE DRAWINGS

The foregoing and other aspects of the invention will be better understood from the following detailed description of the invention, which is provided in connection with the accompanying drawings, in which.

DETAILED DESCRIPTION OF THE INVENTION

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), silicon-on-sapphire (SOS), and silicon-on-nothing (SON) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" or "pixel cell" refers to a picture element unit cell containing a photo-conversion device and transistors for converting electromagnetic radiation to an electrical signal. For purposes of illustration, a representative pixel cell is illustrated in the figures and description herein, and typically fabrication of all pixel cells in an image sensor array will proceed concurrently and in a similar fashion.

Figure 2A:
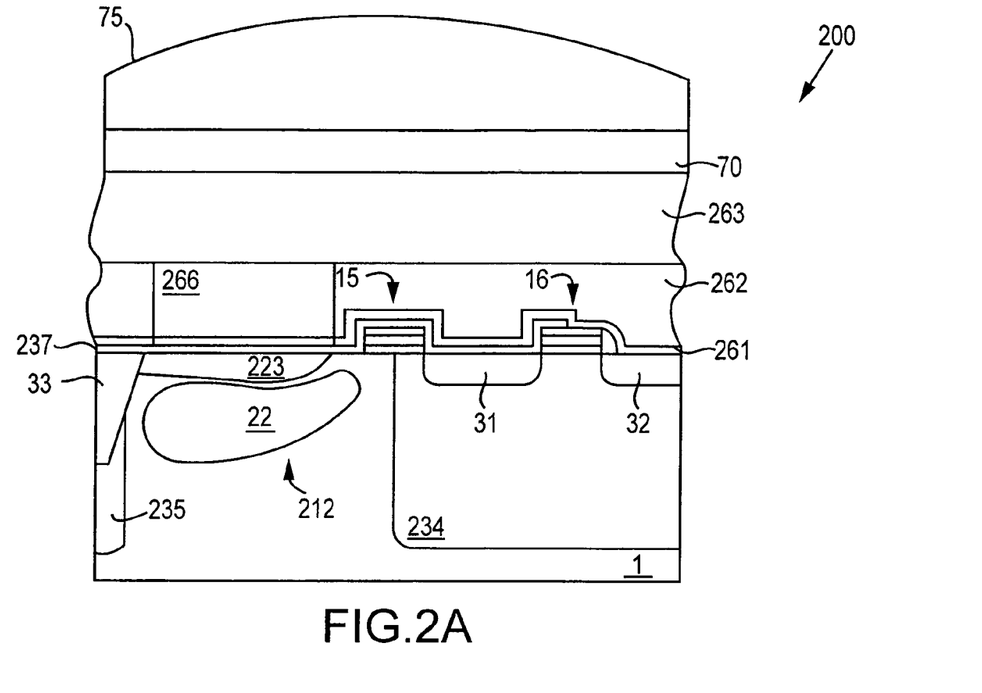
FIG. 2A is a cross sectional view of a pixel cell according to an exemplary embodiment of the invention.
Figure 2B:
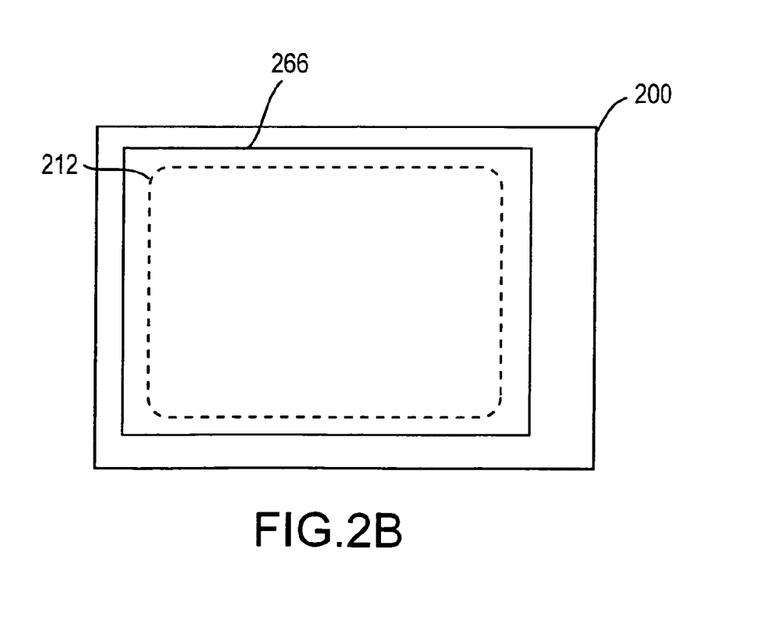
FIG. 2B is a top plan view of a portion of the pixel cell of FIG. 2A.

FIG. 2A is a cross-sectional view of a pixel cell 200 according to an exemplary embodiment of the invention. The pixel cell 200 is similar to the pixel cell 10 depicted in FIGS. 1A and 1B, except that the pixel cell 200 includes a photodiode 212 having a p-type surface layer 223 that is doped with one or more rare earth elements. Additionally, a portion 266 of one or more of the first and second dielectric layers 261, 262 over the photodiode 212 is doped with one or more rare earth elements. In the exemplary embodiment shown in FIG. 1, the first dielectric layer 261 is a layer of tetraethyl orthosllicate (TEOS) and the second dielectric layer is a layer of borophosphosilicate glass (BPSG). The first and second dielectric layers 261, 262 can instead be formed of any suitable dielectric material. Also, as shown in FIG. 2B, the portion 266 preferably, has a top down shape similar to that of the photodiode 212.

According to one exemplary embodiment, the surface layer 223 and dielectric portion 266 are doped with erbium (Er). Erbium is a rare earth element that amplifies optical signals. Erbium ions have quantum levels that allow excitation at wavelengths of 800 nanometers (nm), 980 nm and 1480 nm. Therefore, the Er-doped surface layer 223 and dielectric portion 266 are especially suited for amplifying red, infrared and/or near-infrared wavelengths. The Er-doped surface layer 223 and portion 266 amplify the photons incident on the pixel cell 200 by creating additional photons in response to the incident photons. Such amplification enhances the quantum efficiency of the pixel cell 200. In particular, since the Er-doped surface layer 223 and portion 266 can efficiently emit light at approximately 1.5 nm. Alternatively, the surface layer 223 and portion. 266 can be doped with one of ytterbium (Yb) or neodymium (Nd).

In another exemplary embodiment, one or both of the surface layer 223 and the portion 266 include Er-doped silicon nanocrystals. Silicon nanocrystals serve to enhance the efficiency of photon amplification in the portion 266. After the silicon nanocrystals become excited, they decay radiatively emitting photons.

In still another exemplary embodiment, one or both of the surface layer 223 and the dielectric portion 266 are doped with both Er and Ytterbium (Yb).

Over the layer 262 are one or more interlayer dielectric layers, collectively shown as an ILD region 263. The ILD region 263 also includes conductive structures (not shown), e.g., metal lines, forming connections between devices of the pixel cell 200 and from the pixel cell 200 devices to external devices (not shown). Over the ILD region 263 is a color filter 70, which selects a particular range of wavelengths. In one exemplary embodiment, the color filter 70 selects for one or more of red, infrared and/or near-infrared wavelengths. Although a color filter 70 is shown over the ILD region 263, any suitable filter can be used or the pixel cell 200 can lack a filter. Over the color filter 70 is a lens 75, e.g., a microlens, which focuses light onto the photodiode 212.

If desired, and as shown in FIG. 2A, the pixel cell 200 can include a first conductivity type doped well, e.g., a p-type well 235 surrounding the isolation region 233 and a p-type well 234 below the floating diffusion region 31, the reset transistor 16, and a portion of the transfer transistor 17.

Although not shown in FIG. 2A, the pixel cell 200 also includes source follower transistor 17 having a gate connected to the floating diffusion region 31 and a row select transistor 18 (as shown in FIG. 1A).

FIGS. 3A-3H depict the formation of pixel cell 200 according to an exemplary embodiment of the invention. No particular order is required for any of the actions described herein, except for those logically requiring the results of prior actions. Accordingly, while the actions below are described as being performed in a general order, the order is exemplary only and can be altered if desired.

Figure 3A:
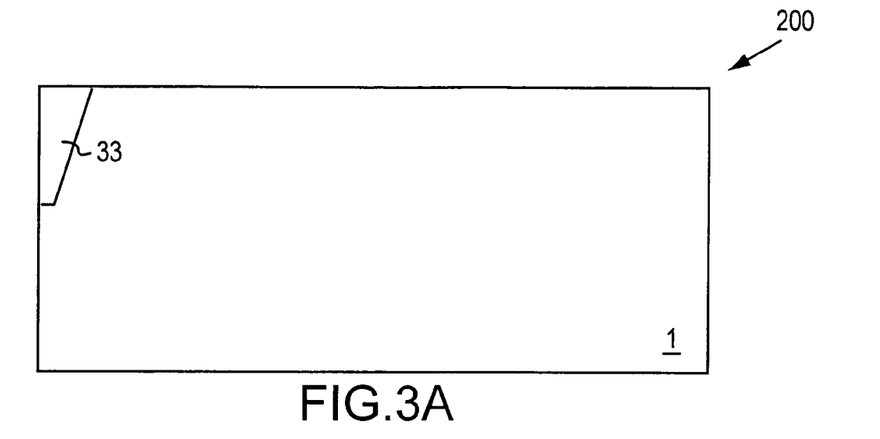
FIG. 3A depicts the pixel cell of FIG. 2A at an initial stage of processing.

FIG. 3A illustrates a pixel cell 200 at an initial stage of fabrication. In the exemplary embodiment, the substrate 1 is a silicon substrate of a first conductivity type, which, for this exemplary embodiment is p-type. An isolation region 33 is formed in the substrate 1 and filled with a dielectric material. The dielectric material may be an oxide material, for example a silicon oxide; oxynitride; a nitride material, such as silicon nitride; silicon carbide; a high temperature polymer; or other suitable dielectric material. As shown in FIG. 3A, the isolation region 33 can be a shallow trench isolation (STI) region. The dielectric material for the STI region is preferably a high density plasma (HDP) oxide, a material which has a high ability to effectively fill narrow trenches.

Figure 3B:
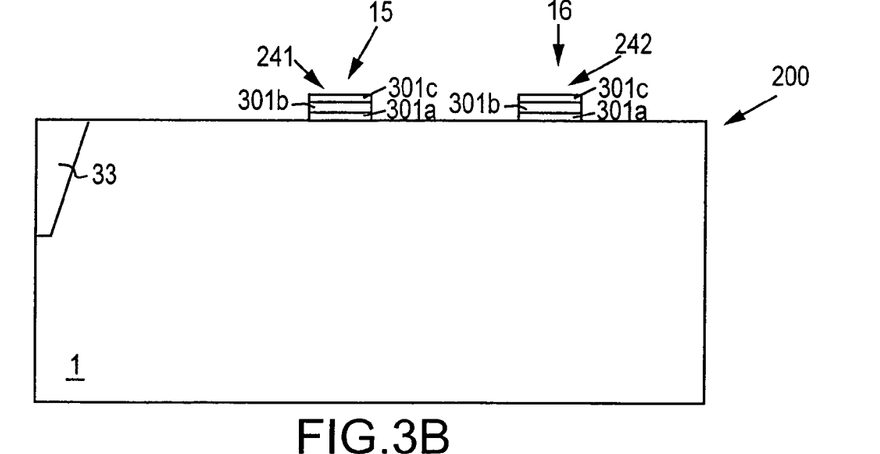
FIGS. 3B-3H depict the pixel cell of FIG. 2A at intermediate stages of processing.

FIG. 3B depicts the formation of the transfer transistor 15 (FIG. 2A) gate stack 241 and the reset transistor 16 (FIG. 2A) gate stack 242. Although not shown, the source follower and row select transistors 17, 18 (FIG. 1A), respectively, can be formed concurrently with the transfer and reset transistors 15, 16 as described below.

To form the gate stacks 241, 242, a first insulating layer 301a of, for example, silicon oxide is grown or deposited on the substrate 1. The first insulating layer 301a serves as the gate oxide layer for the subsequently formed transistor gate electrode. Next, a layer of conductive material 301b is deposited over the oxide layer 301a. The conductive layer 301b serves as the gate electrode for the transistors 15, 16 (FIG. 3). The conductive layer 301b may be a layer of polysilicon, which may be doped to a second conductivity type, e.g., n-type. A second insulating layer 301c is deposited over the conductive layer 301b. The second insulating layer 301c may be formed of, for example, TEOS, a silicon oxide ($SiO_2$), a nitride (e.g., silicon nitride), an oxynitride (silicon oxynitride), ON (oxide-nitride), NO (nitride-oxide), or ONO (oxide-nitride-oxide).

The gate stack layers 301a, 301b, 301c may be formed by conventional deposition methods, such as chemical vapor deposition (CVD) or plasma enhanced chemical vapor deposition (PECVD), among others. The layers 301a, 301b, 301c are then patterned and etched to form the multilayer gate stacks 241, 242 shown in FIG. 3B.

The invention is not limited to the structure of the gate stacks 241, 242 described above. Additional layers may be added or the gate stacks 241, 242 may be altered as is desired and known in the art. For example, a silicide layer (not shown) may be formed between the gate electrodes 301b and the second insulating layers 301c. The silicide layer may be included in the gate stacks 241, 242, or in all of the transistor gate stack structures in an image sensor circuit, and may be titanium silicide, tungsten silicide, cobalt silicide, molybdenum silicide, or tantalum silicide. This additional conductive layer may also be a barrier layer/refractor metal, such as titanium nitride/tungsten (TiN/W) or tungsten nitride/tungsten ($WN_x$/W), or it could be formed entirely of tungsten nitride ($WN_x$).

Figure 3C:
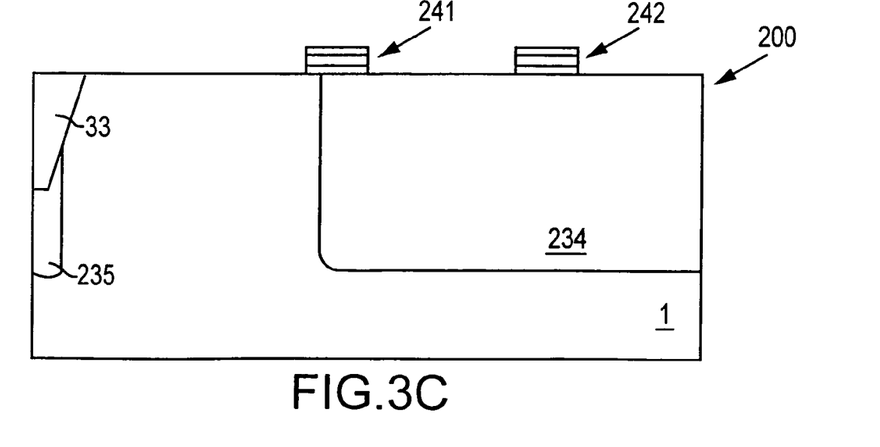

Doped p-type wells 234, 235 are implanted into the substrate 1 as shown in FIG. 3C. The first p-well 235 is formed in the substrate 1 surrounding the isolation region 33 and extending below the isolation region 33. The second p-well 234 is formed in the substrate 1 from a point below the transfer gate stack 241 extending in a direction in the substrate 1 away from where the photodiode 212 (FIG. 2A) is to be formed. The second p-well 234 can be shared with an adjacent pixel cell (not shown).

The p-wells 234, 235 are formed by any known method. For example, a layer of photoresist (not shown) can be patterned over the substrate 1 having an opening over the area where the p-wells, 234, 235 are to be formed. A p-type dopant, such as boron, can be implanted into the substrate 1 through the opening in the photoresist. The p-wells 234, 235 are formed having a p-type dopant concentration that is higher than adjacent portions of the substrate 1. Alternatively, the p-wells 234, 235 can be formed prior to the formation of the isolation region 33.

Figure 3D:
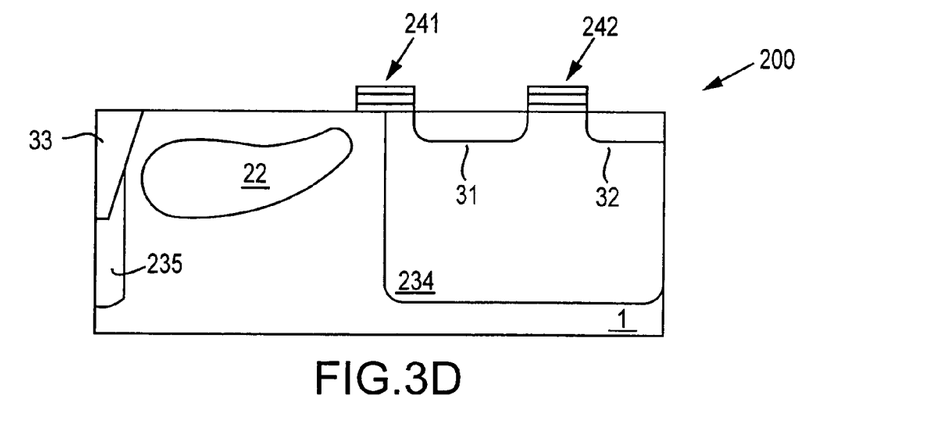

As depicted in FIG. 3D, a doped n-type region 22 is implanted in the substrate 1. For example, a layer of photoresist (not shown) may be patterned over the substrate 1 having an opening over the surface of the substrate 1 where photodiode 212 (FIG. 2A) is to be formed. An n-type dopant, such as phosphorus, arsenic, or antimony, may be implanted through the opening and into the substrate 1. Multiple implants may be used to tailor the doping profile of region 22. If desired, an angled implantation may be conducted to form the doped region 22, such that implantation is carried out at angles other than 90 degrees relative to the surface of the substrate 1.

As shown in FIG. 3D, the n-type region 22 is formed from a point adjacent the transfer gate stack 241 and extending in the substrate 1 between the gate stack 241 and the isolation region 33. The region 22 forms a photosensitive charge accumulating region for collecting photo-generated charge.

The floating diffusion region 31 and source/drain region 32 are implanted by known methods to achieve the structure shown in FIG. 3D. The floating diffusion region 31 and source/drain region 32 are formed as n-type regions. Any suitable n-type dopant, such as phosphorus, arsenic, or antimony, may be used. The floating diffusion region 31 is formed on the side of the transfer gate stack 241 opposite the n-type photodiode region 22. The source/drain region 32 is formed on a side of the reset gate stack 242 opposite the floating diffusion region 31.

Figure 3E:
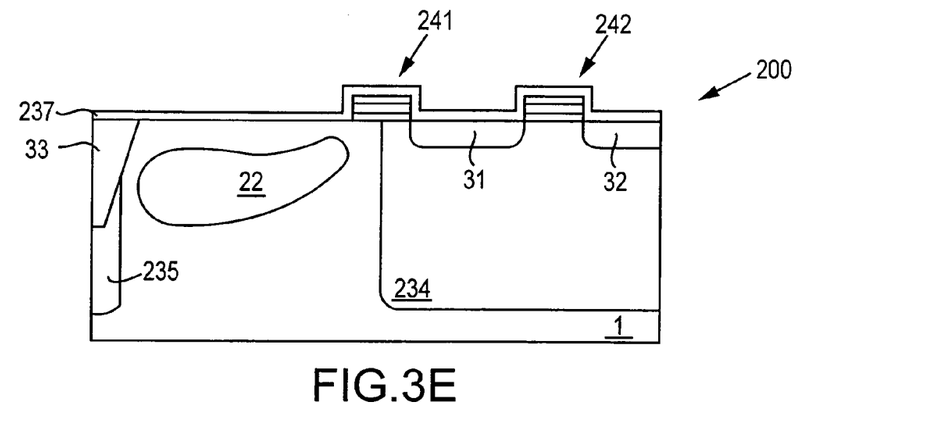

FIG. 3E depicts the formation of a dielectric layer 237. Illustratively, layer 237 is a tetraethyl orthosilicate (TEOS) layer, but layer 237 may be any appropriate dielectric material, such as silicon dioxide, silicon nitride, an oxynitride, among others, formed by methods known in the art.

Figure 3F:
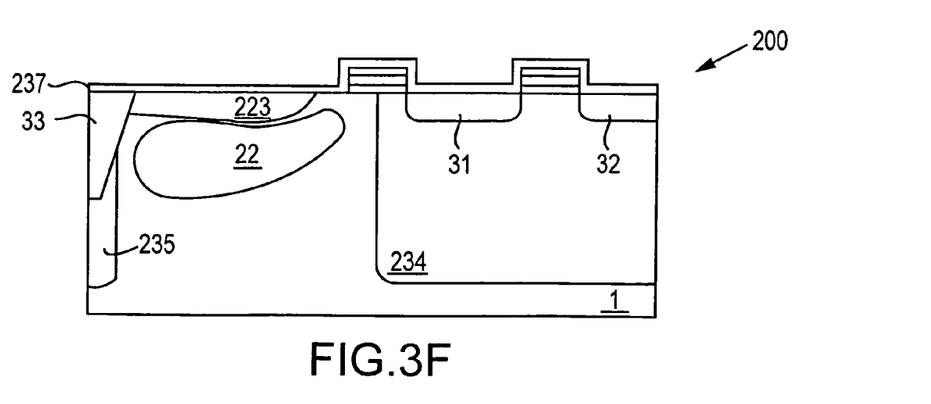

FIG. 3F illustrates the formation of the Er-doped surface layer 223 within the substrate 1. The surface layer 223 is formed using one or more rare earth elements as dopants to create a highly doped p-type surface layer. Preferably, the surface layer 223 is doped with erbium (Er), such that the Er concentration in the surface layer 223 is at approximately the Er solubility limit in silicon. One method of forming the surface layer 223 is by doping using a diffusion source, for example, erbium oxide ($Er_2O_3$). Dissolving erbium oxide, $C_4H_1O_5C_6Er$, and cerium oxide ($CeO_2$) in 1:1 hydrogen chloride (HCl) provides a transparent solution that can be used as a liquid Er source. An anneal step is conducted to diffuse Er into the substrate 1. See Chen et al. "Optoelectronic Property of PN Junction on Erbium-Doped Silicon Using Thermal Diffusion Method," Solid State Electronics 47, pp. 2127-2130 (2003), which is incorporated herein by reference.

Alternatively, Er can be implanted using an erbium chloride source. Preferably, the implantation is conducted at an energy within the range of approximately 100 keV to approximately 300 keV, and more preferably at an energy of approximately 250 keV. The implant dose is within the range of approximately 1e13 atoms/cm$^2$ to approximately 1e15 atoms/cm$^2$. The implant is followed with an inert nitrogen anneal to keep the Er concentration close to the solid solubility limit in silicon. See Tang, et al. "Characteristics of Rare-Earth Element Erbium Implanted in Silicon," Applied Physics Letters 55(5), pp. 432-433 (Jul. 31, 1989), which is incorporated herein by reference.

According to another embodiment of the invention, the surface layer 223 is doped with one of Yb or Nd. In another embodiment, the surface layer 223 is embedded with Er-doped silicon nanocrystals by known techniques. According to still another embodiment of the invention, the surface layer 223 is doped with Er and ytterbium (Yb) by any suitable technique.

Optionally, the surface layer 223 can lack a rare earth element. In such a case, a p-type dopant, such as boron, indium, or any other suitable p-type dopant, may be used to form the p-type surface layer 223. Additionally, if desired, the surface layer 223 can be formed before the n-type region 22 (FIG. 3D).

Figure 3G:
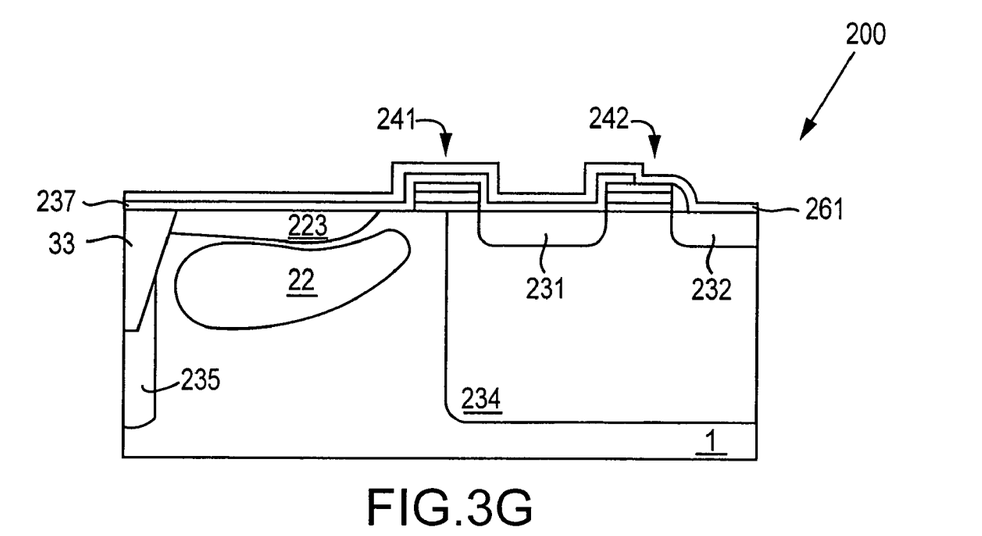

The TEOS layer 237 is etched as shown in FIG. 3G. The remaining portions of the layer 237 form a sidewall spacer on a sidewall of the reset gate stack 242. The layer 237 remains over the transfer gate stack 241, the photodiode 212, the floating diffusion region 31, and a portion of the reset gate stack 242. Alternatively, a dry etch step can be conducted to etch portions of the oxide layer 237 such that only sidewall spacers (not shown) remain on the transfer gate stack 241 and the reset gate stack 242.

Also, a first dielectric layer 261, e.g., another TEOS layer, is formed over the TEOS protective layer 237 to achieve the structure shown in FIG. 3G.

Figure 3H:
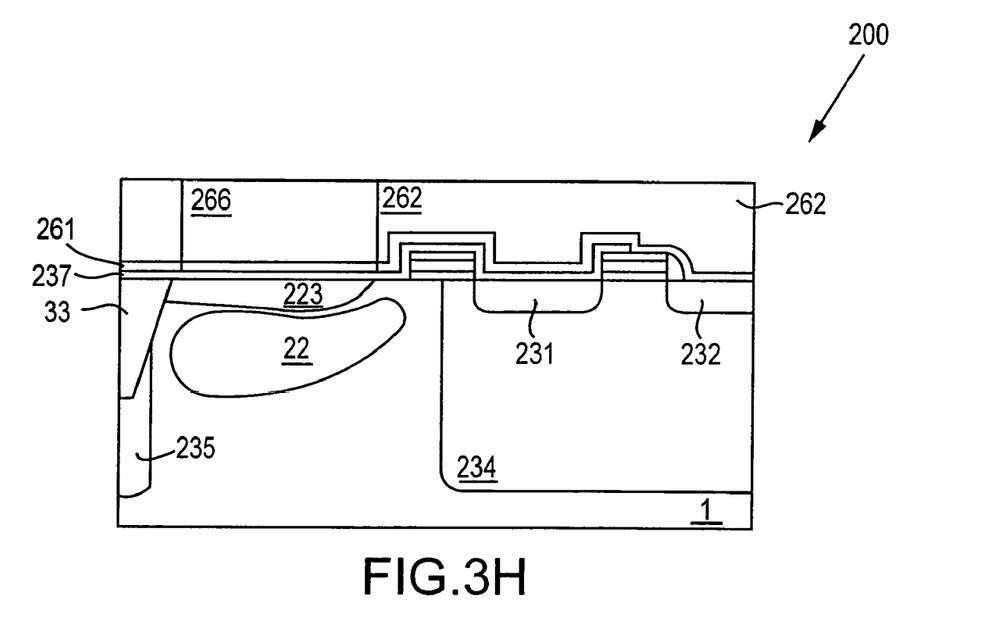

As depicted in FIG. 3H, a second dielectric layer 262 is formed over the TEOS first dielectric layer 261. In the embodiment of FIG. 3H, the second dielectric layer 262 is a layer of BPSG. The portion 266, which includes the TEOS first dielectric layer 261 and BPSG second dielectric layer 262, is doped with one or more rare earth elements. Additionally, if desired, the portion 266 can extend into the TEOS layer 237, such that at least part of the layer 237 is doped with one or more rare earth elements. The portion 266 can have a thickness as small as approximately 500 Angstroms (Å), and can be approximately as thick as the combined thicknesses of the layers 237, 261, 262.

In one exemplary embodiment, the portion 266 is doped with Er as described above in connection with FIG. 3F. In another exemplary embodiment, the portion 266 is doped with one of Yb or Nd. In another exemplary embodiment of the invention, the portion 266 is embedded with Er-doped silicon nanocrystals by any suitable method known in the art. In still another exemplary embodiment of the invention the portion 266 is doped with both Er and Yb by known techniques.

Conventional processing methods are used to form other structures of the pixel 200, to achieve the structure shown in FIG. 2A. Specifically, one or more additional dielectric layers, shown collectively as the ILD region 263 are formed. Also, shielding, and metallization layers to connect gate lines, and other connections of the pixel 300 may be formed. The dielectric layer 263 can be, for example, silicon dioxide, borosilicate glass (BSG), phosphosilicate glass (PSG), or borophosphosilicate glass (BPSG). The layers 261, 262, and ILD region 263 are etched to provide contact holes (not shown), which are then metallized to provide connections between the devices of the pixel cell 200 and to circuitry (not shown) outside the pixel cell 200. Also, a color filter 70 is formed over the ILD region 263 and a microlens 75 is formed over the color filter 70. In one exemplary embodiment, a color filter 70 that selects for one or more of red, infrared and/or near-infrared wavelengths is formed over the ILD region 263.

Figure 4:
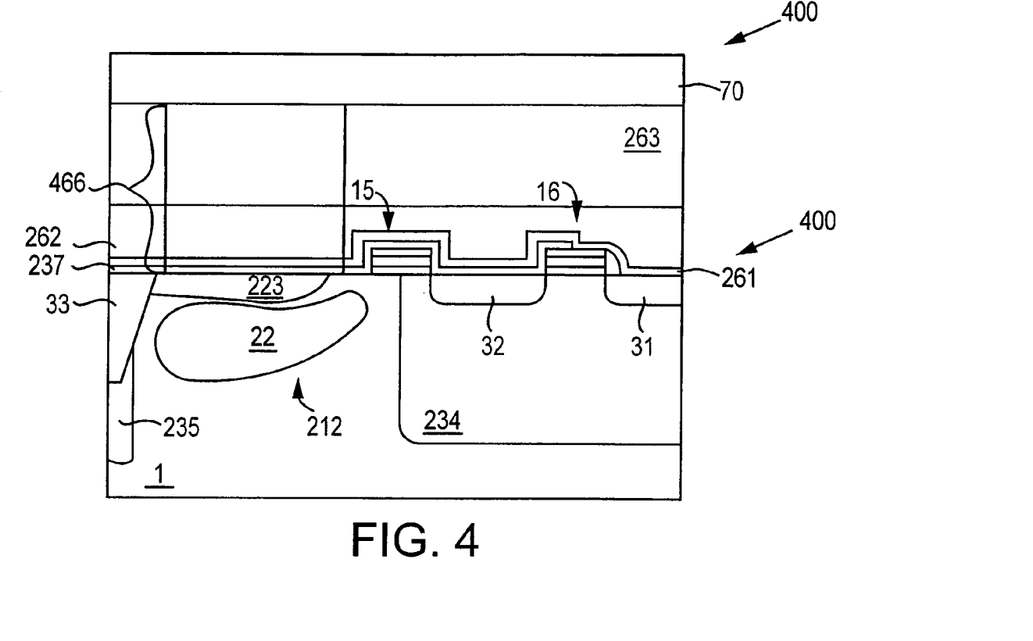
FIG. 4 is a cross sectional view of a pixel cell according to another exemplary embodiment of the invention.

FIG. 4 depicts a pixel cell 400 according to another exemplary embodiment of the invention. The pixel cell 400 is similar to the pixel cell 200 (FIG. 2A), except that instead of a portion 266 (FIG. 2A), the pixel cell 400 has a portion 466 that is doped with one or more rare earth elements. In the exemplary embodiment of FIG. 4, the portion 466 extends from approximately the substrate 1 to approximately the color filter 70. Accordingly, the region 466 can have a thickness approximately equivalent to that of the ILD region 263 (which can contain one or more layers) and the layers 237, 261, 262, for example, approximately 3 micrometers (μm). Alternatively, the portion 466 can extend through only some of the layers 237, 261, 262, 263 and/or only partly though one or more layers 237, 261, 262, 263. Accordingly, the portion 466 could have a thickness from approximately 500 Å to approximately 3 μm.

In one exemplary embodiment, the portion 466 is doped with one of Er, Yb, or Nd. In another exemplary embodiment, the portion 466 is embedded with Er-doped silicon nanocrystals. In still another exemplary embodiment of the invention, the portion 466 is doped with both Er and Yb. The pixel cell 400 can be formed similar to the pixel cell 200 as described above in connection with FIGS. 3A-3H. Instead, however, of forming the portion 266, the portion 466 is formed.

Figure 5:
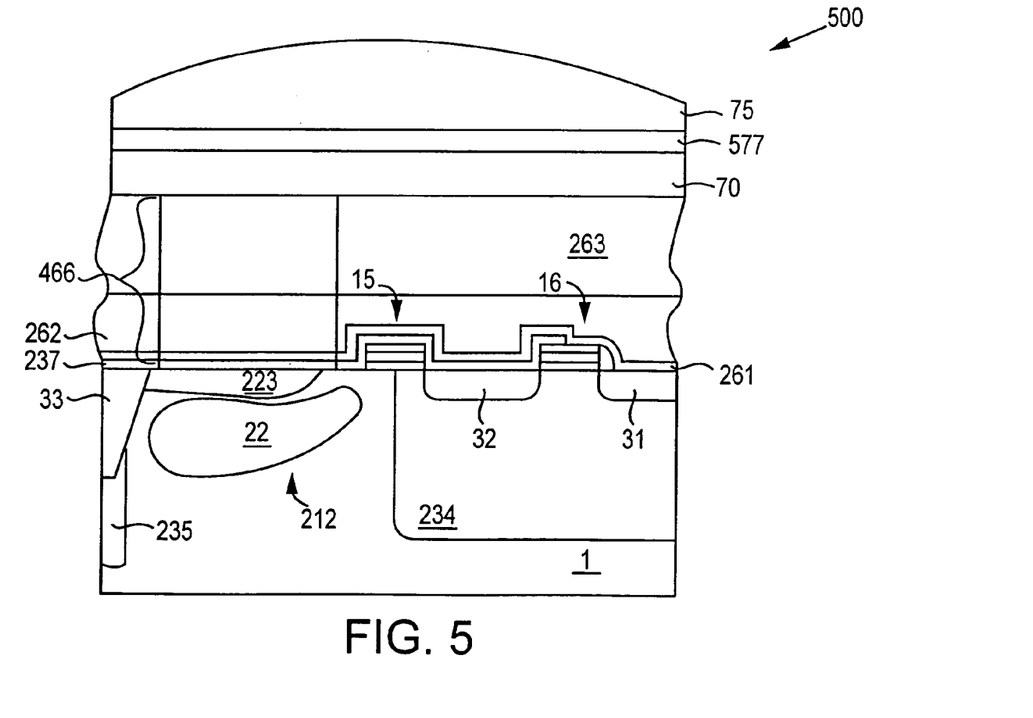
FIG. 5 is a cross sectional view of a pixel cell according to another exemplary embodiment of the invention.

FIG. 5 depicts a pixel cell 500 according to another exemplary embodiment of the invention. The pixel cell 500 is similar to the pixel cell 400, except that the pixel cell 500 includes a dielectric layer 577, which is doped with one or more rare earth elements, between the filter 70 and the microlens 75. The layer 577 can be any suitable dielectric. Preferably the layer 577 is an oxide layer. In one exemplary embodiment, the layer 577 is doped with one of Er, Yb, or Nd. In another exemplary embodiment, the layer 577 is embedded with Er-doped silicon nanocrystals. In still another exemplary embodiment of the invention, the layer 577 is co-doped with Er and Yb. The pixel cell 400 can be formed similar to the pixel cell 400 as described above in connection with FIG. 4, except with additional processing steps. The layer 577 can be formed by any suitable technique and doped as described above in connection with FIG. 3H.

Although the pixel cell 500 is shown including the portion 466, the pixel cell 500 could instead include portion 266 (FIG. 2A). Alternatively, the pixel cell 500 could lack a rare earth element and silicon nanocrystals between the filter 70 and microlens 75.

The pixel cell 500 is particularly suitable when red, near infrared and infrared wavelengths are of interest and are selected for by a filter, e.g., filter 70 (e.g., automobile applications). Photons generated in the layer 577 have wavelengths of approximately 1.5 μm and must pass through the filter 70 before reaching the photodiode 212. Therefore, the photodiode 212 of the pixel cell 500 will only receive the charge amplified by the layer 577 when the filter 70 allows wavelengths of approximately 1.5 μm to pass through.

While the above embodiments are described in connection with the formation of p-n-p-type photodiodes the invention is not limited to these embodiments. The invention also has applicability to other types of photo-conversion devices, such as a photodiode formed from n-p or n-p-n regions in a substrate, a photogate, or a photoconductor. If an n-p-n-type photodiode is formed the dopant and conductivity types of all structures would change accordingly.

Although the above embodiments are described in connection with 4T pixel cell 200, 400, 500, the configuration of pixel cells, 200, 400, 500 is only exemplary and the invention may also be incorporated into other pixel circuits having different numbers of transistors. Without being limiting, such a circuit may include a three-transistor (3T) pixel cell or a five (5T) or more transistor pixel cell. A 3T cell omits the transfer transistor, but may have a reset transistor adjacent to the photo-conversion device. The 5T, 6T, and 7T pixel cells differ from the 4T pixel cell by the addition of one, two, or three transistors, respectively, such as a shutter transistor, a CMOS photogate transistor, and an anti-blooming transistor. Further, while the above embodiments are described in connection with CMOS pixel cells 300, 400, 500, the invention is also applicable to pixel cells in a charge coupled device (CCD) image sensor.

Figure 6:
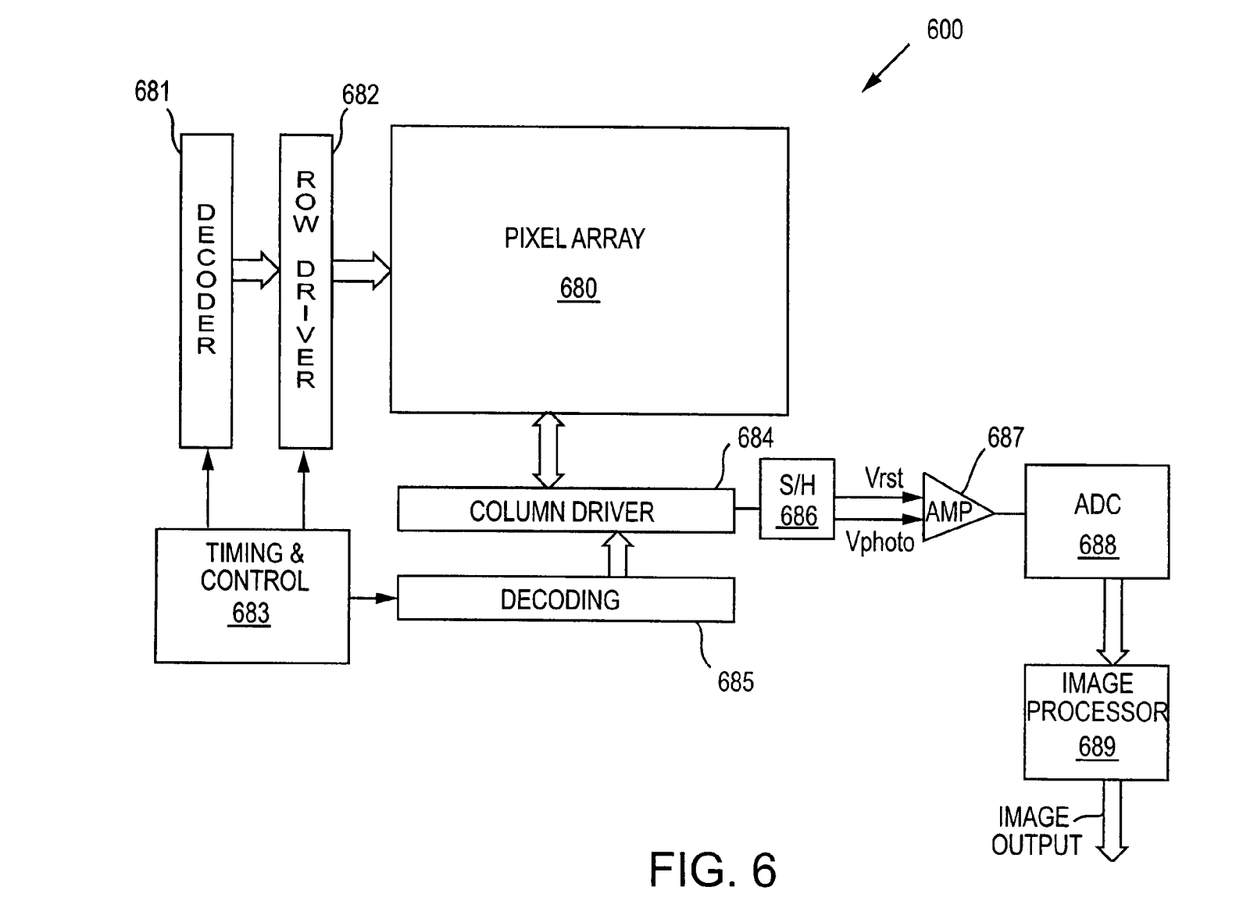
FIG. 6 is a block diagram of an image sensor according to an exemplary embodiment of the invention.

A typical single chip CMOS image sensor 600 is illustrated by the block diagram of FIG. 6. The image sensor 600 includes a pixel cell array 680 having one or more pixel cells 200 (FIG. 2A), 400 (FIG. 4), and/or 500 (FIG. 5) described above. The pixel cells of array 680 are arranged in a predetermined number of columns and rows.

In one exemplary embodiment of the invention, each pixel cell 200 (FIG. 2A), 400 (FIG. 4), and/or 500 (FIG. 5) of the array 680 includes a color filter 70 that selects for one or more of red, infrared and/or near-infrared wavelengths. Preferably, the color filter 70 is common to each pixel cell 200 (FIG. 2A), 400 (FIG. 4), and/or 500 (FIG. 5) of the array 680. That is, the color filter 70 is formed as a single structure shared by all pixel cells 200 (FIG. 2A), 400 (FIG. 4), and/or 500 (FIG. 5) of the array 680.

The rows of pixel cells in array 680 are read out one by one. Accordingly, pixel cells in a row of array 680 are all selected for readout at the same time by a row select line, and each pixel cell in a selected row provides a signal representative of received light to a readout line for its column. In the array 680, each column also has a select line, and the pixel cells of each column are selectively read out in response to the column select lines.

The row lines in the array 680 are selectively activated by a row driver 682 in response to row address decoder 681. The column select lines are selectively activated by a column driver 684 in response to column address decoder 685. The array 680 is operated by the timing and control circuit 683, which controls address decoders 681, 685 for selecting the appropriate row and column lines for pixel signal readout.

The signals on the column readout lines typically include a pixel reset signal ($V_{rst}$), taken from the floating diffusion region after reset, and a pixel image signal ($V_{photo}$), taken after a charge integration period, for each pixel cell. Both signals are read into a sample and hold circuit (S/H) 686 in response to the column driver 684. A differential signal ($V_{rst}-V_{photo}$) is produced by differential amplifier (AMP) 687 for each pixel cell, and each pixel cell's differential signal is digitized by analog-to-digital converter (ADC) 688. The analog-to-digital converter 688 supplies the digitized pixel signals to an image processor 689, which performs appropriate image processing before providing digital signals defining an image output.

Figure 7:
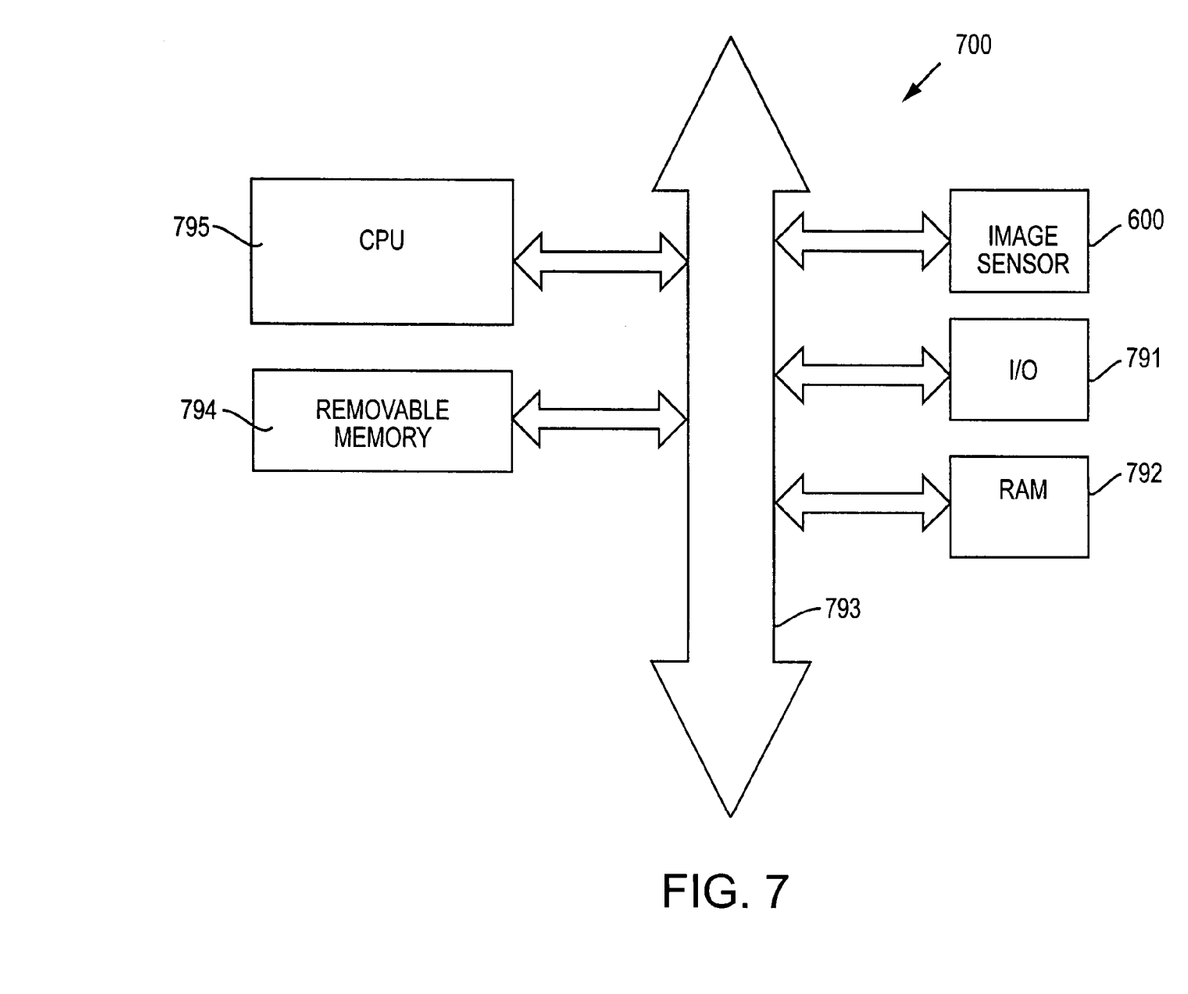
FIG. 7 is a schematic diagram of a computer processor system incorporating the image sensor of FIG. 6.

FIG. 7 illustrates a processor system 700 including the image sensor 600 of FIG. 6. The processor system 700 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, and other systems requiring image acquisition.

The system 700, for example a camera system, generally comprises a central processing unit (CPU) 795, such as a microprocessor, that communicates with an input/output (I/O) device 791 over a bus 793. Image sensor 600 also communicates with the CPU 795 over bus 793. The processor system 700 also includes random access memory (RAM) 792, and can include removable memory 794, such as flash memory, which also communicate with CPU 795 over the bus 793. Image sensor 600 may be combined with a processor, such as a CPU, digital signal processor, or microprocessor, with or without memory storage on a single integrated circuit or on a different chip than the processor.

It is again noted that the above description and drawings are exemplary and illustrate preferred embodiments that achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A pixel cell comprising:
    a substrate;
    a photo-conversion device; and
    a dielectric layer over the photo-conversion device, wherein at least one of the photo-conversion device and dielectric layer comprise a rare earth element.

2. The pixel cell of claim 1, wherein at least one of the photo-conversion device and dielectric layer comprise erbium.

3. The pixel cell of claim 1, at least one of the photo-conversion device and dielectric layer comprise ytterbium.

4. The pixel cell of claim 1, at least one of the photo-conversion device and dielectric layer comprise neodymium.

5. The pixel cell of claim 1, at least one of the photo-conversion device and dielectric layer comprise erbium and ytterbium.

6. The pixel cell of claim 1, at least one of the photo-conversion device and dielectric layer comprise erbium-doped silicon nanocrystals.

7. The pixel cell of claim 1, wherein there are a plurality of dielectric layers over the photo-conversion device, and wherein a portion of the plurality of dielectric layers contains the rare earth element.

8. The pixel cell of claim 7, further comprising a filter over the substrate, wherein the portion of the plurality of dielectric layers containing the rare earth element is between the substrate and the filter.

9. The pixel cell of claim 1, wherein the photo-conversion device comprises a layer doped with the rare earth element at a surface of the substrate.

10. The pixel cell of claim 9, wherein the photo-conversion device is a pinned photodiode.

11. The pixel cell of claim 1, further comprising a filter and a microlens over the filter, wherein the dielectric layer is between the filter and microlens and wherein the dielectric layer comprises the rare earth element.

12. A pixel cell comprising:
    a substrate; and
    a photo-conversion device; the photo-conversion device comprising a rare earth element.

13. The pixel cell of claim 12, wherein the photo-conversion device is a pinned photodiode.

14. A pixel cell comprising:
    a substrate; and
    a pinned photodiode, wherein the substrate is of a first conductivity type and the pinned photodiode comprises a region of a second conductivity type within the substrate and a layer doped with a rare earth element at a surface of the substrate and over the region of a second conductivity type.

* * * * *

UNITED STATES PATENT AND TRADEMARK OFFICE
CERTIFICATE OF CORRECTION

| | | |
|---|---|---|
| PATENT NO. | : 7,443,006 B2 | Page 1 of 1 |
| APPLICATION NO. | : 11/476755 | |
| DATED | : October 28, 2008 | |
| INVENTOR(S) | : Mouli | |

It is certified that error appears in the above-identified patent and that said Letters Patent is hereby corrected as shown below:

On the Title page, Item -54-, in "Title", line 1, delete "OF" and insert -- FOR --, therefor.

In column 1, line 1, delete "OF" and insert -- FOR --, therefor.

Signed and Sealed this

Third Day of March, 2009

JOHN DOLL
*Acting Director of the United States Patent and Trademark Office*